ADJUSTABLE LINE-COUPLING CAPACITOR

Filed April 15, 1949

WITNESSES:

N. F. Susser

Wm. C. Groome

INVENTORS
David L. Balthis and
Karl F. Eger.
BY F. E. Browder
ATTORNEY

United States Patent Office 2,697,138

Patented Dec. 14, 1954

2,697,138

ADJUSTABLE LINE-COUPLING CAPACITOR

David Leonard Balthis, Baltimore, and Karl F. Eger, Ruxton, Md., assignors to Westinghouse Electric Corporation, East Pittsburgh, Pa., a corporation of Pennsylvania Application April 15, 1949, Serial No. 87,622

9 Claims. (Cl. 179—171)

This invention relates to radio apparatus, and particularly to an improved form of line-coupling capacitor of special value in connection with high power, high frequency oscillators, amplifiers and the like.

In order to obtain high power levels at high radio frequencies, it has been found desirable to use a number of vacuum tubes in a single stage of an electron oscillator, amplifier or the like, since such designs afford considerable advantages both from the cost and efficiency viewpoints. Such designs, however, involve additional problems which must be solved in order to obtain optimum output from the apparatus under consideration. For example, in the region from 50 to 1000 megacycles, amplifiers are commonly built with grid-separation circuits and tuning elements of the resonant line type. For single-tube amplifiers, concentric lines or resonant cavities are usually employed as the tuning elements, while conventional two-tube amplifiers have usually included shielded open-wire lines as the tuning elements in a push-pull circuit.

Multi-tube amplifiers have been built using several pairs of tubes connected for push-pull parallel operation, these arrangements being analogous to those employed for push-pull operation of two tubes only. More recently, multi-tube amplifiers have been built in which all of the tubes are operated in a simple parallel connection by placing them in a circular configuration whose center is on the axis of a concentric line or cavity resonator consisting of a geometrical figure of revolution. A multi-tube amplifier of this latter type is described in the copending application of Coleman J. Miller, filed August 17, 1948, Serial No. 44,631, and assigned to the assignee of the present application, and such amplifiers present numerous advantages over prior-art constructions. These advantages are principally associated with the mechanical and electrical symmetry made possible thereby, in that every tube is surrounded by exactly the same configuration, so that if the tubes themselves are balanced, each tube necessarily contributes the same share of the total load. However, in an amplifier of this type, certain special problems are presented, not the least of which is that the means employed for input and output coupling must preserve the mechanical and electrical symmetry of the configuration as seen by each tube.

In the region of the radio spectrum under consideration, namely that from about 50 to about 1000 megacycles per second, power amplifiers of the single tube, two-tube push-pull, and multi-tube parallel push-pull varieties commonly use loops for input and output coupling. However, in multi-tube amplifiers of the kind mentioned above, in which all of the tubes are operated in parallel and are located symmetrically about an axis which is also the axis of a concentric line or cavity resonator consisting of a figure of revolution, this loop coupling technique is not adaptable, since it would require an individual loop for each tube at the high current portions of the cavity resonator or concentric line. The difficulties of maintaining the desired symmetry with such an arrangement, particularly during individual tuning of the separate loops, become extremely burdensome if not impossible.

It is accordingly a principal object of the present invention to provide a novel form of input or output coupling for high power, high frequency amplifiers, oscillators or the like, which is particularly adapted for use with apparatus of the multi-tube, parallel connected type mentioned above and described in the Miller application, and which coupling will overcome the inherent disadvantages and limitations of prior arrangements of this general type.

More specifically, it is an object of this invention to provide a coupling arrangement which may be employed without destroying the required electrical and mechanical symmetry of its associated apparatus.

A further object of the invention is to provide such a coupling which is capable of providing the proper order of coupling impedance within the dimensional limitations of the apparatus with which it is to be used.

Still another object of the invention is to provide a coupling arrangement of the type described in which provision is made for a desired range of adjustment of the coupling impedance, whereby to ensure optimum output and efficiency from the apparatus as a whole.

A further object of the invention is to provide an input or output coupling device in the form of an adjustable capacitor whose construction is inherently symmetrical, and which is adaptable for use with usual forms of input and output lines, such as a conventional concentric line.

An additional object of the invention is to provide an arrangement of this type which is mechanically simple, and which is therefore low in cost and relatively easy to maintain.

The above and other objects and advantages of the invention will best be understood from the following detailed specification of a preferred embodiment thereof, taken in connection with the appended drawing, in which.

Figures 1, 2, 3, 4:
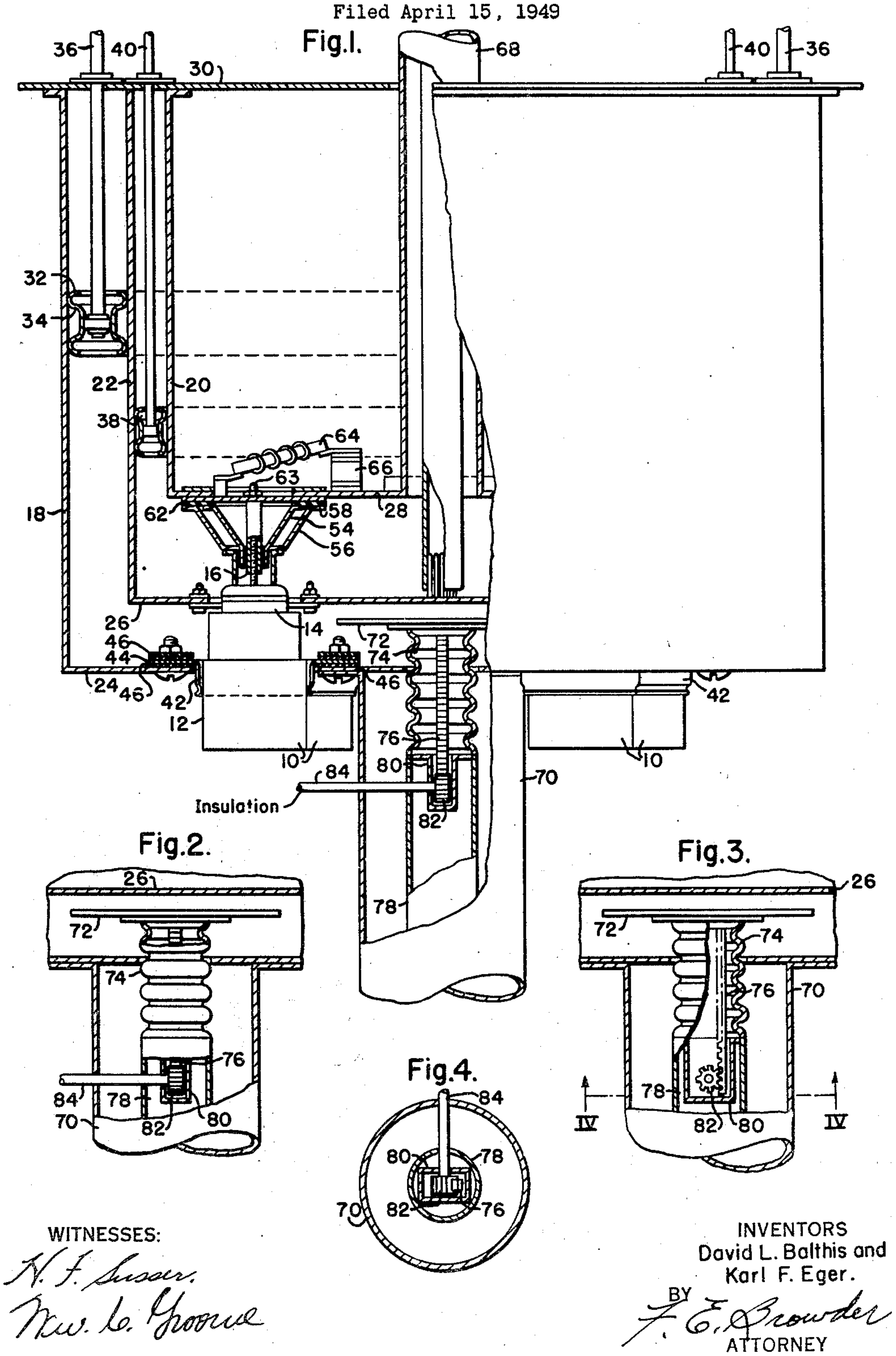
Figure 1 is a side elevation, with parts broken away and parts in section, of a preferred form of coupling arrangement associated with a high power high frequency amplifier of the type described in the copending application referred to above.
Fig. 2 is a view of a portion of Fig. 1, illustrating the coupling arrangement itself.
Fig. 3 is a view similar to Fig. 2 but taken at right angles thereto, to illustrate more clearly the impedance adjusting elements.
Fig. 4 is a sectional view taken on line IV—IV of Fig. 3.

For the purposes of the present application, I have chosen to illustrate the invention as employed in connection with the particular form of high power, high frequency amplifier disclosed in the copending application referred to above, since the invention has particular applicability to arrangements of that type. However, it will be appreciated by those skilled in this art that the coupling arrangements of this invention may also be employed in connection with radio apparatus of totally different types, and that the present invention is not therefore to be considered as limited to use with such specific forms of equipment.

For purposes of the present disclosure therefore, an amplifier of the symmetrical multi-tube parallel type may comprise, as shown in Fig. 1, a plurality of high power vacuum tubes 10 arranged in a circular array about the physical axis of a tank circuit formed entirely of figures of revolution, each of said tubes comprising a plate shell 12, a grid shell 14 and a terminal filament portion 16. The tank circuit common to all of these tubes may be formed as a series of concentric cavities defined by an outer cylindrical wall 18, and inner cylindrical wall 20 and an intermediate cylindrical wall 22. These cylindrical walls are closed as by annular or disc-like end plates 24, 26 and 28 at their lower ends, and by a common annular plate 30 at their upper ends, the latter being apertured for the passage of a concentric line type of grid input circuit 68. Numeral 32 designates a plate cavity tuning bar equipped with spring contact fingers 34, and movable in a vertical direction by means of actuating rods 36. A similar annular tuning bar 38 is provided for the grid cavity, and is actuated by rods 40 or similar means.

Contact rings 42 provide connection to the shells 12 of the various tubes 10, and each ring has a flange 44 separated by a suitable dielectric layer 46 from annulus 24, this arrangement providing a D. C. blocking capacitor between the shells 12 and annulus 24. A similar contact and blocking capacitor arrangement may be provided for the grid shell or connection of each tube, and the filament connection 56 may be flanged as at 58 to overlie a dielectric layer 62. A cooling air duct is provided by the element 54, and electrical conduction to the other filament or cathode lead may be provided as by a post 63, all as more fully described in the above-mentioned prior application. Elements 64 and 66 respectively designate an RF choke and by-pass capacitor for the grid connection, provided for reasons pointed out in the previously mentioned application.

The high frequency power output from the plate cavity is transmitted over a concentric output line designated by numeral 70. Since the impedance looking into this line is considerably lower than the proper load impedance for the tubes 10, and since it is subject to variation, the present invention provides means for obtaining a match between the line impedance and the plate cavity driven by the parallel-connected tubes. This means as herein shown comprises a variable capacitor plate 72 having a peripheral shape which is symmetrical with respect to the array of tubes, and which is centered on the axis of the amplifier itself. In order to maintain this plate in its proper position within the plate cavity, and to permit its adjustment in an axial direction while ensuring a conductive connection to the inner conductor 78 of the concentric output line, the metal plate 72 is welded or otherwise affixed in a conductive manner to the upper end of a tubular, flexible metal bellows 74, whose lower extremity is similarly secured to the upper end of the inner line conductor 78.

As best shown in Figs. 2 to 4, the upper end of conductor 78 is formed to provide a well 80 within which is slidably received a rack bar 76 engaged by a pinion 82 fixedly secured to an insulating shaft or control rod 84 passing through and journalled for rotation in, the concentric conductors 70 and 78, so that rotation of shaft 84 enables slight vertical movements of the capacitor plate 72 with respect to the walls of the plate cavity of the amplifier. Sufficient retardation is provided in the driving mechanism to ensure that the rack and pinion maintain their adjusted positions under expected conditions of use. The distance of plate 72 from the opposite plate of the capacitor (herein the grid plane defined by wall 26 of Fig. 1), and the dimensions of plate 72 and of the bellows 74, are so adjusted as to provide the proper output impedance for matching the amplifier to the output line, for any given adjustment of the plate cavity tuning.

While the plate 72 as shown in the drawing is circular, it is obvious that any other shape may be employed which satisfies the requirement of symmetry with respect to the tube array. The dimensions of this plate may be varied as desired to provide the proper impedance match for a given frequency, in accordance with circuit requirements.

It will be seen from the above that I have provided a form of variable capacitance particularly adapted to the purposes of my invention, and I have described in detail a preferred embodiment thereof as required by the patent statutes. However, the details of the arrangement may be varied widely without departing from the scope of my invention as defined in the appended claims.

I claim as my invention:

1. In combination, a transmission line of the concentric conductor type, a flexible tubular metal bellows connected to an end of one conductor of said line, a capacitor element secured to said bellows, means including a rack and pinion for adjusting the position of said element with respect to the end of said one conductor, and radio apparatus including a resonant cavity, said capacitor element being positioned within said resonant cavity and arranged in capacitive relationship with respect to one wall of said cavity, the position of said capacitor element being adjustable with respect to said one wall.

2. In combination, a transmission line of the concentric conductor type, an inner conductor of said line terminating in a well member, a hollow flexible conductive bellows secured to said inner conductor about said well member, a capacitor member carried by the end of said bellows, cooperating elements within said well member and said bellows for controlling the effective length of said bellows, and radio apparatus including a resonant cavity having an axis, said capacitor member being positioned within said resonant cavity and arranged in capacitive relationship with respect to one wall of said cavity, the length of said bellows being varied along said cavity axis by said cooperating elements to thereby control the distance between the capacitor member and said one wall.

3. In radio apparatus, the combination of a resonant cavity having a wall structure and having an axis, a plurality of vacuum tubes radially positioned about said axis and electrically coupled to said cavity such that the operational frequency of said tubes is determined by said cavity, with each of said tubes including an electrode member that is positioned between said wall structure and said axis, a transmission line coupled to said cavity and having a conductive element, and an adjustable capacitance member connected to said conductive element and in capacitive relation to said cavity, said capacitance member being adjustable along said axis relative to said wall structure of the cavity.

4. In radio apparatus coupling means for impedance matching to an output transmission line, the combination of a resonant cavity having an axis, a plurality of electric discharge devices electrically coupled to said cavity and radially positioned in electrical symmetry about said axis, said cavity including a cylindrical wall member coaxially positioned relative to the axis of the cavity with each of said devices being positioned between said wall member and said axis, a symmetrical capacitor element located on said axis and coupled to said transmission line, and means for adjusting the position of said capacitor element along said axis with respect to said cavity.

5. In radio apparatus the combination of a resonant cavity having an axis, said cavity including a cylindrical wall and an end plate connected to said wall, said end plate being positioned perpendicularly relative to said axis, a transmission line connected to said cavity and having at least one conductive element, a plurality of discharge devices radially positioned about said axis and connected to said end plate, and an adjustable capacitance member connected to said conductive element and in capacitive relation to said end plate, said capacitance member being adjustable in a direction substantially parallel to said axis.

6. In radio apparatus the combination of a resonant cavity having an axis, said cavity including an outer cylindrical wall and an inner cylindrical wall with an end plate connected to one of said walls, said end plate being positioned perpendicular to said axis, a transmission line connected to said cavity coaxially to said axis, said line having at least one conductive element, a plurality of discharge devices radially positioned about said axis and being supported by and connected to said end plate, a capacitance member connected to said conductive element of the transmission line and positioned in capacitive relation to said end plate with the position of said capacitance member being adjustable along said axis relative to said end plate.

7. The apparatus of claim 5 characterized by said plurality of discharge devices being positioned between said cylindrical wall and said axis.

8. The apparatus of claim 6 characterized by said plurality of discharge devices being positioned between said outer cylindrical wall and said axis.

9. The apparatus of claim 5 with said transmission line being connected to said cavity coaxially to said axis.

References Cited in the file of this patent

UNITED STATES PATENTS

| Number | Name | Date |
|---|---|---|
| 2,103,515 | Conklin | Dec. 28, 1937 |
| 2,143,671 | Zottu | Jan. 10, 1939 |
| 2,159,782 | Conklin | May 23, 1939 |
| 2,177,272 | Zottu | Oct. 24, 1939 |
| 2,257,794 | Garner | Oct. 7, 1941 |
| 2,342,897 | Goldstine | Feb. 29, 1944 |
| 2,453,716 | Llewellyn | Nov. 16, 1948 |
| 2,489,433 | Rambo | Nov. 29, 1949 |
| 2,510,613 | Weber et al. | June 6, 1950 |
| 2,554,500 | Preist | May 29, 1951 |
| 2,554,502 | Preist | May 29, 1951 |

FOREIGN PATENTS

| Number | Country | Date |
|---|---|---|
| 248,351 | Switzerland | Apr. 30, 1947 |